US012568763B2

(12) United States Patent
Dupont et al.

(10) Patent No.: US 12,568,763 B2
(45) Date of Patent: Mar. 3, 2026

(54) METHOD FOR TRANSFERRING A LAYER

(71) Applicant: COMMISSARIAT A L'ENERGIE ATOMIQUE ET AUX ENERGIES ALTERNATIVES, Paris (FR)

(72) Inventors: Florian Dupont, Grenoble Cedex (FR); Guillaume Rodriguez, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 189 days.

(21) Appl. No.: 18/061,839

(22) Filed: Dec. 5, 2022

(65) Prior Publication Data

US 2024/0188444 A1 Jun. 6, 2024

(30) Foreign Application Priority Data

Dec. 6, 2021 (FR) ...................................... 21 13024

(51) Int. Cl.
*H10N 30/072* (2023.01)
*B32B 37/00* (2006.01)
(Continued)

(52) U.S. Cl.
CPC ......... *H10N 30/072* (2023.02); *B32B 37/025* (2013.01); *B32B 37/24* (2013.01);
(Continued)

(58) Field of Classification Search
CPC ............. H10N 30/072; H10N 30/8542; H10N 30/076; H10N 30/079; H10N 30/073;
(Continued)

(56) References Cited

U.S. PATENT DOCUMENTS 6,017,795 A 1/2000 Hsieh et al.
6,124,609 A 9/2000 Hsieh et al.
(Continued)

FOREIGN PATENT DOCUMENTS

EP 1 583 162 A2 10/2005

OTHER PUBLICATIONS

French Preliminary Search Report Issued Sep. 8, 2022, in French Application 21 13024 filed on Dec. 6, 2021(with English Translation of Categories of Cited Documents & written opinion), 12 pages.
(Continued)

*Primary Examiner* — S. Behrooz Ghorishi
(74) *Attorney, Agent, or Firm* — Oblon, McClelland, Maier & Neustadt, L.L.P.

(57) ABSTRACT

A method for transferring a layer of interest from a donor substrate to a receiver substrate includes providing the donor substrate made of a transparent material at a wavelength λ, forming at least one sacrificial buffer layer made of an absorbent sacrificial material at the wavelength λ, on the donor substrate, forming the layer of interest on the at least one sacrificial buffer layer, and bonding the layer of interest on the receiver substrate. The at least one sacrificial buffer layer is illuminated by a laser at the wavelength λ through the donor substrate so as to remove the at least one sacrificial buffer layer to separate the layer of interest from the donor substrate.

20 Claims, 9 Drawing Sheets

(51) Int. Cl.

| | |
|---|---|
| *B32B 37/24* | (2006.01) |
| *C30B 23/02* | (2006.01) |
| *C30B 23/06* | (2006.01) |
| *C30B 29/30* | (2006.01) |
| *H10N 30/076* | (2023.01) |
| *H10N 30/079* | (2023.01) |
| *H10N 30/853* | (2023.01) |

(52) U.S. Cl.

CPC .......... *C30B 23/025* (2013.01); *C30B 23/066* (2013.01); *C30B 29/30* (2013.01); *H10N 30/8542* (2023.02); *B32B 2037/243* (2013.01); *B32B 2310/0843* (2013.01); *H10N 30/076* (2023.02); *H10N 30/079* (2023.02)

(58) Field of Classification Search

CPC . B32B 37/025; B32B 37/24; B32B 2037/243; B32B 2310/0843; C30B 23/025; C30B 23/066; C30B 29/30; H03H 3/08; H03H 9/02015; H03H 9/02559; H03H 9/02574; H03H 3/02

See application file for complete search history.

(56) References Cited

U.S. PATENT DOCUMENTS

| | | | | |
|---|---|---|---|---|
| 6,574,251 | B1 * | 6/2003 | Gambini | ............... H01S 5/0687 |
| | | | | 372/28 |
| 2005/0225208 | A1 | 10/2005 | Yasui et al. | |
| 2006/0076584 | A1 | 4/2006 | Kim et al. | |
| 2012/0273784 | A1 | 11/2012 | Kim et al. | |
| 2015/0328872 | A1 * | 11/2015 | Koyanagi | ............... H01L 21/78 |
| | | | | 156/73.1 |
| 2018/0175283 | A1 * | 6/2018 | Akiyama | ................ B32B 37/18 |
| 2019/0293972 | A1 * | 9/2019 | Sasaki | ...................... G02B 6/12 |
| 2020/0058842 | A1 * | 2/2020 | Akiyama | ................ H03H 3/08 |
| 2020/0270464 | A1 * | 8/2020 | Tsunematsu | ......... C09D 11/037 |
| 2020/0381303 | A1 * | 12/2020 | Hoshino | ............ H01L 21/6836 |
| 2024/0048115 | A1 * | 2/2024 | Inoue | ...................... H03H 3/02 |

OTHER PUBLICATIONS

Suwa et al., "Fabrication of high-efficiency piezoelectric energy harvesters of epitaxial Pb (Zr, Ti) $O_3$ thin films by laser lift-off"., Energy Harvesting and Systems, 2016, vol. 3, No. 1, 7 pages.

Bartasyte et al., "Toward high-quality epitaxial $LiNbO_3$ and $LiTaO_3$ thin films for acoustic and optical applications", Advanced Materials Interfaces, 2017, vol. 4, No. 8, 36 Pages.

Bhattacharyya et al., "On the evolution of stresses due to lattice misfit at a Ni-superalloy and YSZ interface", Surfaces and Interfaces, 2018, vol. 12, 32 Pages.

Janski et al., "Lithium barrier materials for on-chip Si-based microbatteries", Journal of Materials Science: Materials in Electronics, 2017, vol. 28, No. 19, 10 Pages.

Takamine et al., "A novel 3.5 GHz low-loss bandpass filter using IHP SAW resonators", 2018 Asia-Pacific Microwave Conference (APMC). IEEE, 2018, 1 page (English abstract).

Vispute et al., "Epitaxial TIN based contacts for silicon devices", Journal of Electronic Materials, 1996, vol. 25, No. 11, 1 Page (English abstract).

Wong et al., "Damage-free separation of GaN thin films from sapphire substrates", Applied Physics Letters, 1998, vol. 72, No. 5, 3 Pages.

Zivasatienraj et al., "Epitaxy of $LiNbO_3$.—Historical Challenges and Recent Success", Crystals, 2021, vol. 11, No. 4, 13 Pages.

* cited by examiner

METHOD FOR TRANSFERRING A LAYER

TECHNICAL FIELD

The present invention generally relates to a method for transferring a layer. This method advantageously makes it possible to transfer a layer of good crystalline quality, from a donor substrate to a receiver substrate. A particularly interesting application of the implementation of this method is the manufacturing of electroacoustic devices, for example, surface acoustic wave or volume acoustic wave devices, on a silicon-based receiver substrate.

STATE OF THE ART

Resonators based on a so-called SAW (Surface Acoustic Wave)-type or BAW (Bulk Acoustic Wave)-type structure are commonly used to produce radiofrequency (RF) filters. The core of these resonators is composed of a piezoelectric material which impacts the final properties of the filter.

Lithium niobate (LiNbO3) has been used for several years as piezoelectric material. Its intrinsic properties, like its piezoelectric coupling coefficient, could enable filters to resonate at high frequency, for example at frequencies greater than 3.5 GHZ, and/or with a wide bandwidth, for example, up to 600 MHz. To obtain a high coupling coefficient, typically up to 50%, the LiNbO3-based piezoelectric layer must, in particular, have a high crystalline quality and a controlled stoichiometry.

A high crystalline quality and a controlled stoichiometry are generally obtained by making bulk LiNbO3 substrates grow. Such substrates however do not suit most applications in the fields of electroacoustic devices and optical devices, which generally require a thin LiNbO3 layer.

The document, "A. Reinhardt et al., Acoustic filters based on thin single crystal LiNbO3 films: Status and prospects Proc.—IEEE Ultrason. Symp. 2014.773" discloses a solution based on a transferring method known under the name Smart-Cut™, making it possible to manufacture a BAW filter comprising an LiNbO3-based piezoelectric layer on silicon substrate. A thin LiNbO3 layer is removed from a donor substrate, typically from a monocrystalline LiNbO3 substrate, then transferred to a receiver substrate, typically a silicon substrate. This solution implements numerous technical steps and has a significant cost.

Moreover, this method of transferring by Smart-Cut™ does not make it possible to transfer thin layers of a low thickness, for example of a few tens of nanometres, nor transfer thin layers of a high thickness, typically around 1 μm or more.

Moreover, the necessity for a healing annealing following the ion implantation subjects the substrate to high temperatures. This prevents the use of functionalised layers under the substrate.

There is therefore a need consisting of transferring a lithium niobate-based layer or a material having similar properties, such as lithium tantalum, for example, on a silicon-based substrate, by limiting the costs, and for a wide range of layer thicknesses.

An aim of the present invention is to at least partially meet this need.

Other aims, features and advantages of the present invention will appear upon examining the following description and accompanying drawings. It is understood that other advantages can be incorporated.

SUMMARY

To achieve this aim, according to an embodiment, a method for transferring a layer of interest from a donor substrate to a receiver substrate is provided, said layer of interest being lithium niobate (LiNbO3)-, or lithium tantalum (LiTaO3)-based, or an Li(Ta,Nb)O3 alloy, or an oxide perovskite ABO3, O being oxygen, A and B being two distinct chemical elements taken from among calcium (Ca), sodium (Na), potassium (K), barium (Ba), lithium (Li), lead (Pb), zirconium (Zr), titanium (Ti), niobium (Nb), tantalum (Ta). The method comprises the following steps:

Providing the donor substrate made of a transparent material at a wavelength λ,

Forming at least one sacrificial buffer layer made of a sacrificial material absorbing the wavelength λ, by epitaxy on the donor substrate, Forming the layer of interest by epitaxy on the at least one sacrificial buffer layer, Bonding the layer of interest on the receiver substrate, Illuminating by laser, the wavelength λ the at least one sacrificial buffer layer through the donor substrate, so as to remove at least partially said at least one sacrificial buffer layer to separate or contribute to separating the layer of interest from the donor substrate.

Thus, the method advantageously makes it possible to lift off a raw layer of interest by epitaxy, without implantation, by using a sacrificial buffer layer which is at least partially removable by laser. This method can therefore be qualified as a laser "lift off" method ("lift off" being the term generally used). The at least partial removal of the sacrificial buffer layer can be done by evaporation and/or by dissociation, for example. The flow and/or the parameters of the laser (power, duration, frequency, etc.) are typically chosen in order to obtain an effective dissociation of the sacrificial buffer layer.

According to the method, the sacrificial buffer layer is chosen so as to absorb a major part of the light flow of wavelength A. The donor substrate, and preferably the layer of interest, are chosen so as to be transparent to the wavelength A. Thus, only the sacrificial buffer layer is affected by the light flow during the laser illumination. The sacrificial buffer layer is selectively dissociated with respect to the substrate and the layer of interest. The layer of interest is not advantageously affected by the light flow. This avoids inducing structural defects in the layer of interest.

According to the method, the sacrificial buffer layer and the layer of interest are subjected to epitaxy on the donor substrate. There is therefore an epitaxy relationship between the layer of interest and the substrate via the sacrificial buffer layer. The crystalline orientations of the donor substrate, of the sacrificial buffer layer and of the layer of interest are preferably identical. The growth of the sacrificial buffer layer and the growth of the layer of interest are preferably done so as to keep a structural coherence with the donor substrate. Thus, the mesh parameter of the sacrificial buffer layer is about equal to that of the donor substrate. The crystalline structure of the sacrificial buffer layer is not relaxed. The mesh parameter of the layer of interest is about equal to that of the sacrificial buffer layer. This avoids the appearance of structural defects by plastic relaxation of the mechanical stresses in the sacrificial buffer layer and/or in the layer of interest. According to an example, the layer of interest and the donor substrate are with the basis of the same material.

The different layers subjected to epitaxy typically preserve a crystalline continuity between one another. Thus, the donor substrate, the sacrificial buffer layer, the layer of interest having a crystalline continuity in the plane, similarly to a monocrystal. This makes it possible to obtain a greater quality. The different epitaxies typically involve certain stresses on the choice of materials, in particular in terms of crystalline structure, and of method enabling the epitaxy of the different layers of the stack.

The sacrificial buffer layer therefore has at least one first function consisting of ensuring the epitaxial growth of the layer of interest, and at least one second function consisting of enabling the laser lift off.

Advantageously, the method makes it possible to obtain a high crystalline quality of the layer of interest, comparable with the crystalline quality of a layer subjected to homoepi-taxy. Moreover, all the thicknesses of the layer of interest are achievable, in particular of low thicknesses of a few nano-metres or tens of nanometres, due to the formation of this layer of interest by growth.

Advantageously, after laser lift off, the donor substrate is not damaged. Contrary to an ion implantation, the laser illumination does not damage the donor substrate. It can be reused so as to achieve a new sacrificial buffer layer and layer of interest growth.

Thus, with respect to the transferring method known under the name Smart-Cut™, the transferring method according to the present invention makes it possible to transfer the layer of interest by limiting the costs, without implantation nor healing annealing. It also makes it possible to target a wider range of thickness of the layer of interest.

According to a preferred example, the layer of interest is with the basis of one from among lithium niobate LiNbO3, lithium tantalum LiTaO3, or an alloy, for example Li(Nb, Ta)O3. The sacrificial buffer layer can be aluminium nitride AlN- or AlInN-based. In this case, a laser illumination with a wavelength λ of the ultraviolet range UV will be chosen. Alternatively, the sacrificial buffer layer can be titanium nitride TIN-based. In this case, preferably a laser illumina-tion with a wavelength λ of the infrared range IR will be chosen. The substrate is preferably based on the same According to a technical prejudice, an LiNbO3-LiTaO3-based layer of interest, called LN/LT layer, must necessarily be subjected to epitaxy on an oxide-based buffer layer, in order to avoid a loss of stoichiometry of the LN/LT layer by oxygen diffusion.

On the contrary, in the scope of the development of the present invention, it has been fully unexpectedly observed that a nitride-based buffer layer makes it possible to subject the LN/LT layer to epitaxy under good conditions. Surpris-ingly, it has been also observed that such a buffer layer makes it possible to block both the oxygen diffusion and the lithium diffusion to the donor substrate. It results from this, that the LN/LT layer subjected to epitaxy on such a buffer layer preserve the required stoichiometry.

Moreover, such a nitride-based buffer layer generally absorbs in UV and/or in IR, while the LN/LT layer and the donor substrate are transparent in these wavelength ranges. Such a "sacrificial" buffer layer is therefore advantageously at least partially dissociated by UV or IR Illumination.

The present invention thus proposes an inexpensive solu-tion making it possible to transfer a high quality crystalline layer of interest on a receiver substrate adapted to the targeted applications, for example a silicon-based receiver substrate.

BRIEF DESCRIPTION OF THE FIGURES

The aims, objectives, as well as the features and advan-tages of the invention will best emerge from the detailed description of embodiments of the latter which are illus-trated by the following accompanying drawings, wherein.

Figure 1A:
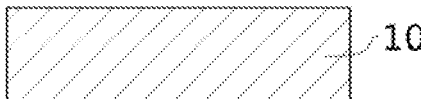
FIGS. 1A to 1I illustrate, as a transverse cross-section, a method for transferring a layer of interest according to an embodiment of the present invention.

The drawings are given as examples and are not limiting of the invention. They constitute principle schematic repre-sentations intended to facilitate the understanding of the invention and are not necessarily to the scale of practical applications. In particular, in the principle diagrams, the thicknesses of the different layers and portions, and the dimensions of the patterns are not representative of reality.

DETAILED DESCRIPTION

Before starting a detailed review of embodiments of the invention, optional features are stated below, which can optionally be used in association or alternatively:

According to an example, the epitaxial formations of the at least one sacrificial buffer layer and of the layer of interest are configured such that said at least one sacrificial layer and layer of interest are structurally coherent to one another and with the donor substrate and/or together have and with the donor substrate, a continuity of crystalline structure. In particular, said at least one sacrificial layer and layer of interest and the donor substrate have respectively crystalline structures aligned in the plane of the donor substrate. This makes it possible to preserve the crystalline quality of the donor substrate. The donor substrate is preferably monoc-rystalline. The thicknesses of formed layers, in particular that of the sacrificial buffer layer, are preferably chosen so as to avoid a plastic relaxation of the stresses. The sacrificial buffer layer thickness can typically be less than a critical thickness beyond which the plastic relaxation occurs. The growth of the sacrificial buffer layer, for thicknesses less than the critical thickness, can be pseudomorphic. The sacrificial buffer layer subsequently has substantially the same mesh parameter as the donor substrate. In the case of a layer of interest of the same nature as the substrate, the growth of said layer of interest on the sacrificial buffer layer subsequently approaches a homoepitaxy. The structural coherence corresponds to the alignment of the crystalline arrays. This coherence can be verified by X-ray diffraction.

According to an example, the removal of the sacrificial buffer layer by illumination enables it alone to separate the layer of interest from the donor substrate. Alternatively, to reach a complete separation of the layer of interest vis-à-vis the donor substrate, an additional step is also applied, for example a mechanical urging contributing to the lifting off of the layer of interest.

According to an example, the layer of interest is with the basis of an ABO3 material, O being oxygen, A being at least one first chemical element taken from among lithium (Li), sodium (Na), potassium (K), barium (Ba), lead (Pb), and B being at least one chemical element taken from among lead (Pb), zirconium (Zr), titanium (Ti), niobium (Nb), tantalum (Ta).

According to an example, the layer of interest is with the basis of one from among lithium niobate LiNbO3, lithium tantalum LiTaO3, or Li(Nb, Ta)O3. According to an example, the layer of interest is with the basis of an oxide perovskite ABO3 taken from among BaTiO3, Pb(Zr,Ti)O3, (K,Na)NbO3.

According to an example, the wavelength $\lambda$ of the laser is chosen in the infrared range. According to an example, the sacrificial material absorbing the at least one sacrificial buffer layer is with the basis of a transition refractory nitride, for example TiN, VN, ZrN, TaN, HfN, NbN, or their alloys. These materials have a good absorption in the IR range.

According to an example, the wavelength $\lambda$ of the laser is chosen in the ultraviolet range. According to an example, the sacrificial material absorbing the at least one sacrificial buffer layer is with the basis of a nitride III-N, for example aluminium nitride AlN, gallium nitride GaN, boron nitride BN, indium nitride InN, or their alloys. These materials have, in particular, a good absorption in the UV range.

According to an example, the formation of the at least one sacrificial buffer layer comprises at least one sequence comprising:

a formation of a first sacrificial buffer layer with the basis of the absorbing sacrificial material, then
   a formation of an interlayer with the basis of the transparent material of the substrate, then
   a formation of a second sacrificial buffer layer with the basis of the absorbent material.

This makes it possible to increase the total thickness of the absorbent sacrificial material, for example beyond a critical thickness, by preserving limited absorbent sacrificial material thicknesses, for each of the first and second sacrificial buffer layers. Thus, the thicknesses of each of the sacrificial buffer layers can each be less than the critical thickness, which makes it possible to preserve a good epitaxial relationship, while offering a total thickness of absorbent sacrificial material sufficient for significantly absorbing the light flow of wavelength $\lambda$ during the illumination.

According to an example, the formation of the at least one sacrificial buffer layer is configured such that said at least one sacrificial buffer layer has a thickness less than a critical thickness beyond which structural defects appear in said at least one sacrificial buffer layer, during epitaxy. Such a critical thickness can be determined experimentally, according in particular to the nature of said sacrificial buffer layer.

According to an example, the substrate and the layer of interest are with the basis of the same material.

According to an example, the method further comprises, before bonding of the layer of interest on the receiver substrate, a formation of a so-called functional layer on the layer of interest. According to an example, the bonding of the layer of interest on the receiver substrate is done by way of said functional layer.

According to an example, the functional layer forms at least one from among an electrode, a mirror reflecting the wavelength $\lambda$, an acoustic confinement layer.

According to an example, the transparent material of the donor substrate is chosen from among the following materials: LiNbO3, LiTaO3, sapphire Al2O3. According to an example, the receiver substrate is chosen as silicon-based.

According to an example, the method further comprises, after separation of the layer of interest of the donor substrate, a healing annealing.

According to an example, the method further comprises, after formation of the layer of interest, a flattening of the layer of interest.

According to an example, the absorbent sacrificial material is chosen so as to have a crystallographic structure compatible with the donor substrate and the layer of interest, such as a hexagonal or face centred cubic structure. This makes it possible to limit the appearance of structural defects during the formation of the layer of interest by epitaxy.

According to an example, the formation of the sacrificial buffer layer is configured such that said sacrificial buffer layer has a thickness $e_{20}$ of between 10 nm and 1000 nm, for example 100 nm. This makes it possible to obtain the desired crystalline quality and/or to limit the appearance of structural defects.

According to an example, the formation of the layer of interest is configured such that said layer of interest has, after epitaxy, a thickness $e_{30}$ less than 100 nm, and/or greater than 500 nm. The method also makes it possible to form and transfer a layer of interest having a thickness $e_{30}$ of between 100 nm and 500 nm, as this could be reachable by techniques using Smart-Cut. However, the formation of the layer of interest according to the method of the invention, makes it possible to avoid an implantation generating defects and/or a healing annealing, which are necessary Smart-Cut steps.

According to an example, the formation of the sacrificial buffer layer and/or the formation of the layer of interest are done by pulsed laser deposition.

According to an example, the formation of the sacrificial buffer layer and the formation of the layer of interest are done by pulsed laser deposition successively within one same reactor without flushing with air between said formations. This makes it possible to avoid an intermediate surface cleaning step, to reduce the total duration of the method and to limit the costs. This also makes it possible to obtain a low surface roughness of the layer of interest.

According to an example, the layer of interest is directly in contact with the sacrificial buffer layer. In particular, there is no oxide interlayer between the sacrificial buffer layer and the layer of interest.

Unless incompatible, it is understood that all of the optional features above can be combined so as to form an embodiment which is not necessarily illustrated or described. Such an embodiment is obviously not excluded from the invention.

It is specified that, in the scope of the present invention, the terms "on", "surmounts", "covers", "underlying", "opposite" and their equivalents do not necessarily mean "in contact with". Thus, for example, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers of one same material or of different materials.

By a substrate, a stack, a layer "with the basis" of a material A, this means a substrate, a stack, a layer comprising this material A only or this material A and optionally other materials, for example alloy elements and/or doping elements. Thus, a silicon-based substrate means, for example, an Si, doped Si, SiC, SiGe substrate. An AlN-based layer means, for example, an AlN, doped AlN layer, or AlN alloys, for example AlInN.

In the present description, a material is considered as absorbent at a wavelength λ as soon as it absorbs at least 50% of a light radiation of wavelength A, preferably at least 70%, and advantageously, at least 90%. A material is considered as transparent at a wavelength λ as soon as it transmits at least 90% of a light radiation of wavelength λ, preferably at least 95%.

Several embodiments of the invention implementing successive steps of the transfer method are described below. Unless explicitly mentioned, the adjective "successive" does not necessarily imply, even if this is generally preferred, that the steps immediately follow one another, intermediate steps being able to separate them.

Moreover, the term "step" means the embodiment of some of the method, and can mean a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single and inseparable actions over time and in the sequence of phases of the method.

A preferably orthonormal marker, comprising the axes x, y, z is represented in the accompanying figures. When one single marker is represented in one same set of figures, this marker applies to all the figures of this set.

In the present patent application, the thickness of a layer is taken in a direction normal to the main extension plane of the layer. Thus, a layer typically has a thickness along z. The relative terms "on", "surmounts", "under", "underlying", "inserted" refer to positions taken in the direction z.

The terms "vertical", "vertically" refer to a direction along z. The terms "horizontal". "horizontally", "lateral", "laterally" refer to a direction in the plane xy. Unless explicitly mentioned, the thickness, the height and the depth are measured along z.

An element located "in vertical alignment with" or "to the right of" another element means that these two elements are both located on one same line perpendicular to a plane wherein a lower or upper face of a substrate mainly transfers, i.e. on one same line oriented vertically in the figures.

Several SAW- or BAW-type electroacoustic devices can be advantageously manufactured by benefiting from the transfer method described of the present invention. These devices are, for example:

SAW-TF ("Thin Film"), which typically comprises a thin piezoelectric layer on a substrate making it possible to confine the acoustic wave;

BAW-HBAR ("High overtone Bulk Acoustic Resonator"); this is the substrate itself which is the location of stationary waves, typically over several tens or hundreds of micrometres;

BAW-FBAR ("Film Bulk Acoustic Resonator"); this is a membrane, separated from the substrate by a vacuum zone, which resonates.

This list is not limiting. Other devices can be considered.

Other applications can also be considered, for example in the field of guided optics.

In the scope of the present invention, a transition refractory nitride is a nitride of a transition metal or transition element (element of which the atoms have an incomplete electronic sublayer d, or which can form cations, of which the electronic sublayer d is incomplete). These elements are grouped together within the block d of the periodic table of elements. A refractory nitride III-N is a nitride with the basis of an element of column III or IIIB of the periodic table.

In the examples described below, the LN/LT layer illustrated is lithium niobate LiNbO3-based. By "LN/LT", this means, in particular, "lithium niobate LiNbO3 (LN) or lithium tantalate LiTaO3 (LT)" or an alloy of both of the Li(Nb, Ta)O3 type. Other layers or materials, in particular the ABO3-based layers mentioned above, can be substituted for this LN/LT layer in the scope of this invention.

X-ray diffraction analyses, for example in configuration 2θ, or in rotation along φ and/or Ω (phi-scan and omega-scan), can be performed so as to determine the crystalline quality of the different piezoelectric layers and/or sacrificial buffer layers, and their epitaxy relationships.

FIGS. 1A to 1I illustrate, as a transverse cross-section, a method for transferring by laser lift off of a layer of interest according to an embodiment of the present invention.

FIG. 1A illustrates, as a transverse cross-section, a donor substrate 10, for example lithium niobate LiNbO3-, lithium tantalate LiTaO3-, or sapphire Al2O3-based. The donor substrate 10 is preferably monocrystalline. It can have a preferably crystalline orientation, for example along (001). Other crystalline orientations can be considered for the donor substrate 10, for example according to the targeted application. The table 1 below summarises different possible crystalline orientations according to the applications, for LiNbO3 and LiTaO3 substrates.

TABLE 1

|  | Preferred orientations for a SAW application | Preferred orientations for a BAW application | Preferred orientations for an optoelectronic application |
|---|---|---|---|
| LiNbO3 | (104) (110) Y + 41 cut | (110) (012) (202) | (001) |
| LiTaO3 | Y + 42 cut | (110) (202) | all orientations |

The donor substrate 10 is transparent at the wavelength λ of interest, i.e. at the wavelength of the laser used for the lift off, subsequently. This, in particular, makes it possible to illuminate the sacrificial buffer layer 11 through the donor substrate 10.

Figure 1B:
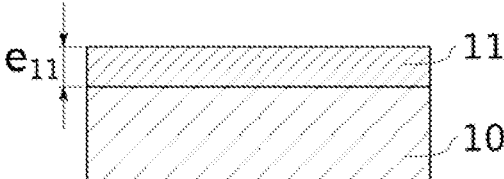

FIG. 1B illustrates the formation by epitaxy of a sacrificial buffer layer 11 made of a sacrificial material, for example AlN-, or AlInN-, or GaN-, or GaInN-based, on the donor substrate 10. According to another example, this sacrificial buffer layer 11 can be titanium nitride TiN-, or vanadium nitride VN-, or zirconium nitride ZrN-, or tantalum nitride TaN-, or hafnium nitride HfN-, or niobium nitride NbN-based. Generally, the sacrificial material of the sacrificial buffer layer 11 can be with the basis of a transition metal nitride, or of a nitride III-N, or of an alloy of either of these nitrides, for example, TiAlN.

The sacrificial buffer layer 11 has a crystallographic structure compatible with that of the donor substrate 10, and with that of the layer of interest for which it serves as a nucleation layer. The sacrificial buffer layer 11 has, for example, a hexagonal or face centred cubic structure. It preferably also has a preferable crystallographic orientation, typically induced by that of the donor substrate 10.

The sacrificial buffer layer 11 is absorbent at the wavelength λ of interest. It typically absorbs at least 20% and preferably at least 50% of the light flow of the wavelength λ transmitted by the laser during the lift off step by illumination. The sacrificial buffer layer 11 is significantly more absorbent than the donor substrate 10 at the wavelength λ of interest.

This sacrificial buffer layer 11 has a thickness $e_{11}$ chosen so as to obtain a good compromise between the absorption (the greater the thickness $e_{11}$ is, the more the layer 11 absorbs) and the crystalline quality (the greater the thickness $e_{11}$ is, the more the probability of structural defects appearing within the layer 11 increases). The thickness $e_{11}$ is preferably less than the critical thickness beyond which a plastic relaxation of the stresses appears. This thickness $e_{11}$ is typically of between a few nanometres and few tens or a few hundred nanometres, for example between 1 nm and 20 nm. The sacrificial buffer layer 11 is in an epitaxial relationship with the donor substrate 10. It typically remains structurally coherent with the donor substrate 10, and optionally is not relaxed (it typically has a residual stress state). After epitaxy, the sacrificial buffer layer 11 has substantially the same mesh parameter as the donor substrate 10 if it has the same crystalline structure, or conversely, has interatomic distances in the plane of the growth substantially close to those of the donor substrate 10. It is therefore monocrystalline when the donor substrate 10 is itself monocrystalline.

The sacrificial buffer layer 11 can be formed by a physical or chemical deposition technique, for example by pulsed laser deposition (PLD). It is, for example, formed by one of the following techniques: chemical vapour deposition (CVD), preferably metal organic chemical vapour deposition (MOCVD), PVD (sputtering).

Figure 1C:
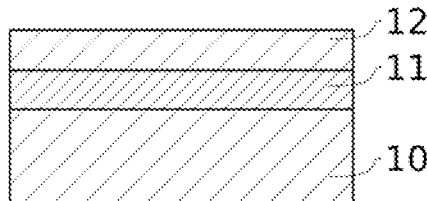

FIG. 1C illustrates the epitaxial formation of a layer of interest 12 on the sacrificial buffer layer 11. This layer of interest 12 can be, for example, with the basis of a so-called LN/LT material, with the basis of lithium niobate LiNbO3 or lithium tantalate LiTaO3, or an Li(Nb,Ta)O3 alloy. It is advantageously subjected to epitaxy on the sacrificial buffer layer 11 which has substantially the same mesh parameter as the donor substrate 10 (or interatomic distances in the interface plane substantially close to those of the donor substrate 10). It can be monocrystalline or polycrystalline, with, for example, a preferably orientation. According to a possibility, the layer of interest 12 is with the basis of the same material as the donor substrate 10. It can have substantially the same crystalline quality as the donor substrate 10. It has the same crystallographic orientation. An orientation along a growth plane (001) can be typically chosen. This makes it possible, for example, to maximise the propagation speed of the acoustic waves within an LN/LT layer 12, typically in the scope of an application to electroacoustic devices. Other orientations can be chosen according to the desired application, for example (104), (110), (012), (202) or along the cross-sections Y+41 or Y+42.

This layer of interest 12 can be formed by a physical or chemical deposition technique, for example by pulsed laser deposition PLD. It is, for example, formed by one of the following techniques: chemical vapour deposition (CVD), preferably metal organic chemical vapour deposition (MOCVD). PVD (sputtering), molecular beam epitaxy (MBE).

The LN/LT layer of interest 12 formed on the sacrificial layer 11 is preferably stoichiometric, for example $Li_1Nb_1O_3$. The atomic percentage of lithium is ideally close to 50%. The LN/LT layer of interest 12 has a thickness $e_{12}$ typically of between a few tens or hundreds of nanometres and a few microns, for example of around 200 nm. The thickness $e_{12}$ of the layer of interest 12 can be chosen according to the desired application, for example according to the desired frequency of the resonance for an electroacoustic device, or also according to the wavelength of a light flow to guide for an optical waveguide.

According to a possibility, the sacrificial buffer layer 11 and the layer of interest 12 are both produced in situ by PLD in one same growth reactor. The growth of the layer of interest 12 can thus be done directly after the end of growth of the sacrificial buffer layer 11. This makes it possible to avoid a flushing with air of the sacrificial buffer layer 11 before epitaxy of the layer of interest 12. The surface of the sacrificial buffer layer 11 therefore remains clean. This avoids an intermediate cleaning step. The duration of the method is thus decreased. This also makes it possible to limit the appearance of roughness during the formation of the layer of interest 12. The surface state of the latter is thus optimised.

At this stage, the successive epitaxies of the layers 11 and 12 make it possible, in particular, to obtain a layer of interest 12, for example made of stoichiometric LiNbO3, preferably oriented and of high crystalline quality. The thickness $e_{12}$ of this layer of interest 12 obtained by epitaxy is further fully controlled.

Figure 1D:
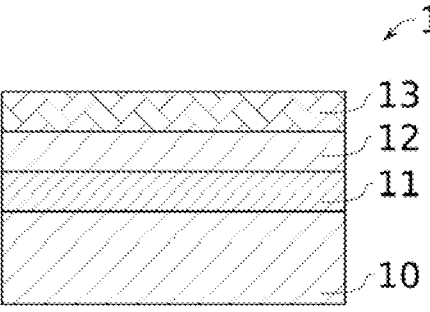

As illustrated in FIG. 1D, after growth of the layer of interest 12, a bonding layer 13, for example SiO2-based, can be deposited on the layer of interest 12 so as to form the stack 1. This bonding layer 13 can be alternatively with the basis of a resin, for example an epoxy resin.

Figure 1E:
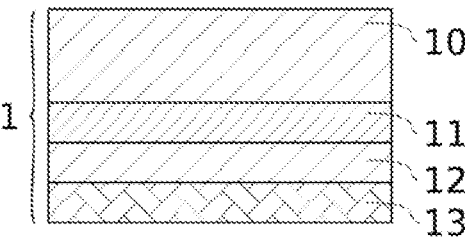
Figure 1E:
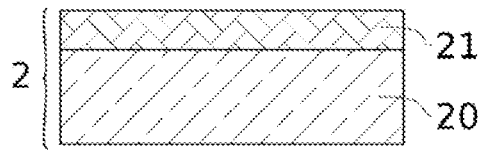
Figure 1E:
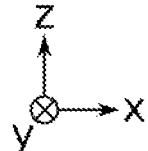

As illustrated in FIG. 1E, the stack 1 is thus brought facing a second stack 2 comprising the receiver substrate 20 and preferably a second bonding layer 21, for example, SiO2-based. In the example illustrated in FIG. 1E, the bonding of the stack 1 and 2 by molecular bonding between the bonding layers 13, 21 facing one another. Such a molecular bonding is fully known to a person skilled in the art.

The receiver substrate 20 can be a so-called silicon bulk substrate. Alternatively, this substrate 20 can be an SOI (Silicon On Insulator)-type substrate. Other receiver substrates 20 can be considered, for example SiC-based substrates, SiGe-based substrates, SiGe-based substrates, GeOI (Germanium On Insulator) substrates. Such substrates have a total compatibility with silicon technologies for microelectronics.

Figure 1F:
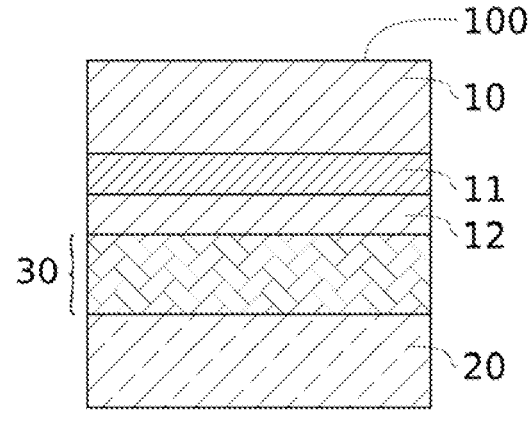
Figure 1F:
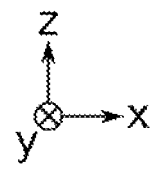

FIG. 1F illustrates the two substrates 10, 20 bonded by way of the layer 30, after molecular bonding.

Figure 1G:
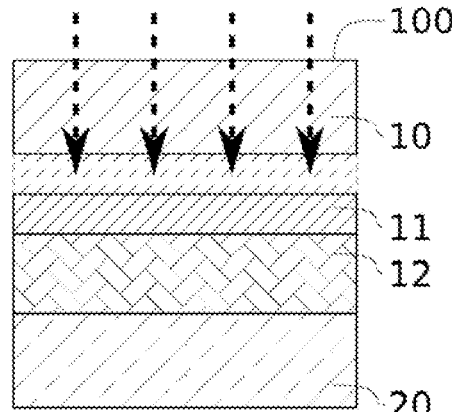
Figure 1G:
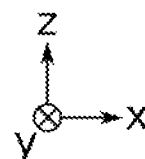
Figure 1H:
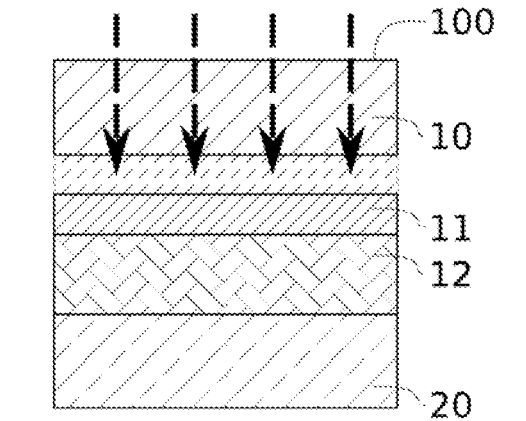

FIGS. 1G and 1H illustrate steps of laser illumination of the sacrificial buffer layer 11, respectively at the wavelengths λ=λ1 and λ=λ2. These steps can be carried out alternatively from one another. The illumination is done preferably from a rear face 100 of the donor substrate 10. The donor substrate 10 is transparent to the wavelengths λ1 and λ2. The sacrificial layer 11 is absorbent at the wavelength λ1 and/or λ2. According to an example illustrated in FIG. 1G, the sacrificial buffer layer 11 is with the basis of a nitride III-N and the wavelength λ=λ1 is chosen in the UV range, for example λ1=248 nm with a GaN layer 11. According to an alternative example illustrated in FIG. 1H, the sacrificial layer 11 is with the basis of a transition nitride and the wavelength λ=λ2 is chosen in the IR range, for example λ2=1100 nm with a TiN layer 11.

The illumination step is configured so as to remove at least partially the sacrificial buffer layer 11, so as to lift off or separate the layer of interest 12 from the donor substrate 10. A part 11v of the sacrificial layer 11 can be typically vaporised or dissociated during this illumination step. The illumination parameters, in particular the fluence of the laser, are chosen and adapted according to the thickness and to the nature of the sacrificial layer 11, so as to enable this partial removal or dissociation. The fluence of the laser can, for example, be of between 200 mJ/cm$^2$ and 500 mJ/cm$^2$. 20 and will be adapted according to the application duration of the laser. The laser can be pulsed. A laser fluence of 400 mJ/cm$^2$ for 38 ns typically makes it possible to remove or dissociate a GaN-based sacrificial buffer layer.

Figure 1I:
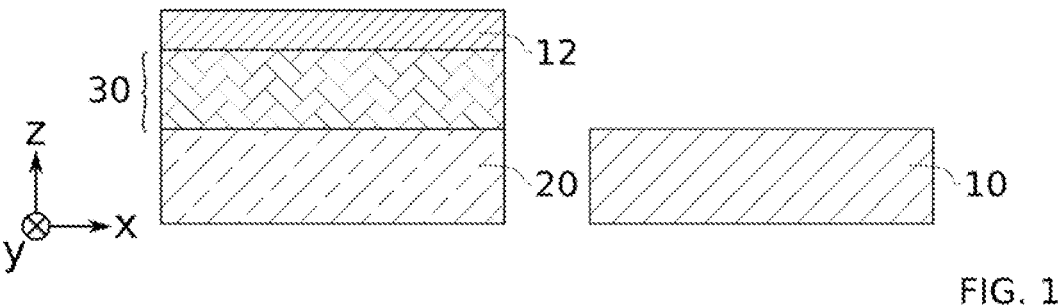

As illustrated in FIG. 1I, after illumination, the donor substrate 10 can be separated from the layer of interest 12. The layer of interest 12 is thus located on the receiver substrate 20 by way of the bonding layer 30. An optional flattening step, for example by chemical mechanical polishing CMP or by etching, can be performed on the surface of the layer of interest 12, for example to completely remove residues coming from the sacrificial buffer layer 11. The donor substrate 10 can further be advantageously reused, for example for new sacrificial buffer layer 11 and layer of interest 12 epitaxies. This makes it possible to decrease the cost of the method.

Figure 2:
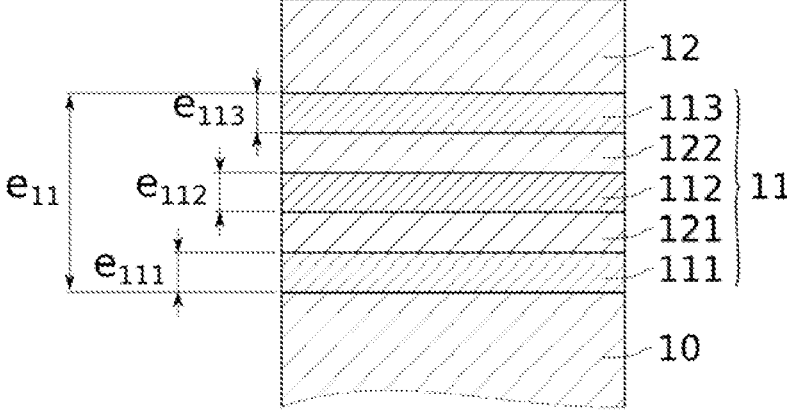
FIG. 2 illustrates, as a transverse cross-section, a sacrifi-cial buffer layer comprising a plurality of alternate sublay-ers, according to an embodiment of the present invention.

FIG. 2 illustrates another embodiment, wherein the sacrificial buffer layer 11 comprises absorbent sublayers 111, 112, 113 and transparent sublayers 121, 122 alternately. In this example, the absorbent sublayers 111, 112, 113 are with the basis of the sacrificial material, and the transparent sublayers 121, 122 are with the basis of the LN/LT material. The formation of a sacrificial buffer layer 11 in several sublayers 111, 112, 113 advantageously makes it possible to increase the total thickness $e_{11}$ of absorbent layer, while avoiding exceeding the critical thickness for each of the sublayers 111, 112.113. Thus, each thickness $e_{111}$, $e_{112}$, $e_{113}$ is less than the critical thickness beyond which a relaxation of the stresses appears. This makes it possible to limit the appearance of defects in these sublayers, in particular of dislocations. The transparent sublayers 121, 122 formed by epitaxy subsequently have a good crystalline quality. This makes it possible to preserve a good epitaxial relationship all along the stack of the sublayers 111, 121, 112, 122, 113. The layer of interest 12 can 10) subsequently be formed by epitaxy with an improved crystalline quality. The total thickness $e_{11}$ of the absorbent layers being moreover increased, the absorption of the laser flow during illumination is improved. This induces a localised temperature increase at one or more sublayers 111, 112, 113. The dissociation of the sacrificial buffer layer 11 is facilitated.

FIGS. 3A to 3F illustrate, as a transverse cross-section, a method for transferring by laser lift off of a layer of interest according to another embodiment of the present invention.

Figure 3A:
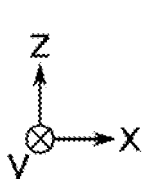
FIGS. 3A to 3F illustrate, as a transverse cross-section, a method for transferring a layer of interest according to another embodiment of the present invention.
Figure 3A:
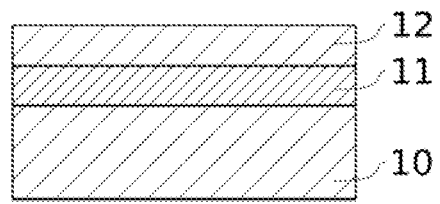

FIG. 3A illustrates, as a transverse cross-section, a stack comprising the substrate 10, the sacrificial buffer layer 11 and the layer of interest 12, obtained as above and also illustrated in FIG. 1C.

Figure 3B:
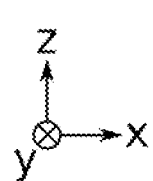
Figure 3B:
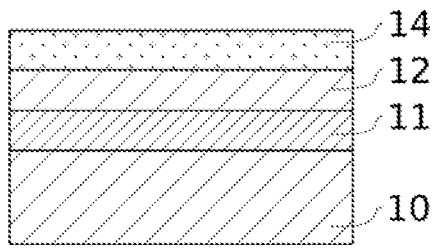

In this embodiment, as illustrated in FIG. 3B, a functional layer 14, in this case a mirror, is formed on the layer of interest 12. This mirror 14 is intended to reflect at least partially the light flow of wavelength λ implemented during the laser lift off. The material used for the mirror 14 is in particular chosen according to the wavelength λ=λ1, λ2 chosen for the illumination phase. It can typically be with the basis of a metal, for example made of aluminium. The mirror 14 can have a thickness of a few tens of nanometres to a few hundred nanometres.

Figure 3C:
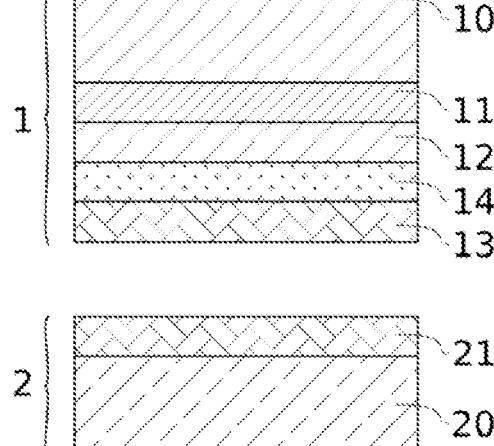

As illustrated in FIG. 3C, the bonding layer 13 is formed on the mirror 14, then this first stack 1 is brought facing the second stack 2 in order to proceed with the molecular bonding, as above.

Figure 3D:
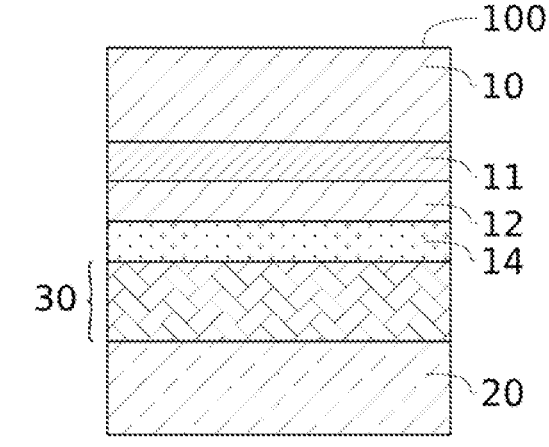

Thus, a structure is obtained, comprising, in a stack along z, the receiver substrate 20, the bonding layer 30, the mirror 14, the layer of interest 12, the sacrificial buffer layer 11, and the donor substrate 10, such as illustrated in FIG. 3D.

Figure 3E:
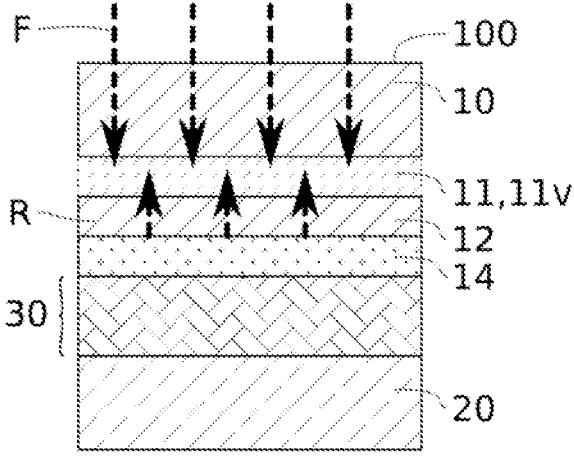
Figure 3E:
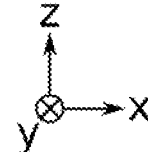

As illustrated in FIG. 3E, the illumination of the sacrificial buffer layer 11 is then performed through the substrate 10, from the rear face 100. Advantageously, the mirror 14 makes it possible to reflect some of the light flow which has not been absorbed by the sacrificial buffer layer 11, so as to return this flow not absorbed in the direction of the sacrificial buffer layer 11. The sacrificial buffer layer 11 is thus directly illuminated, by the main light flow F coming from the substrate 10, and indirectly, by the reflected light flow R coming from the mirror 14. This makes it possible to increase the quantity of light flow actually absorbed by the sacrificial layer 11. The optical power and/or the fluence of the laser can be decreased by making it possible to dissociate a part 11v of the sacrificial layer 11. This avoids or limits a damaging of the substrate 10 and/or of the layer of interest 12 and/or of the substrate 20. This also makes it possible to use a reduced sacrificial buffer layer 11 thickness, with respect to an embodiment without a mirror. A reduced sacrificial buffer layer 11 thickness makes it possible, in particular, to limit the appearance of defects in the layer of interest 12.

Figure 3F:
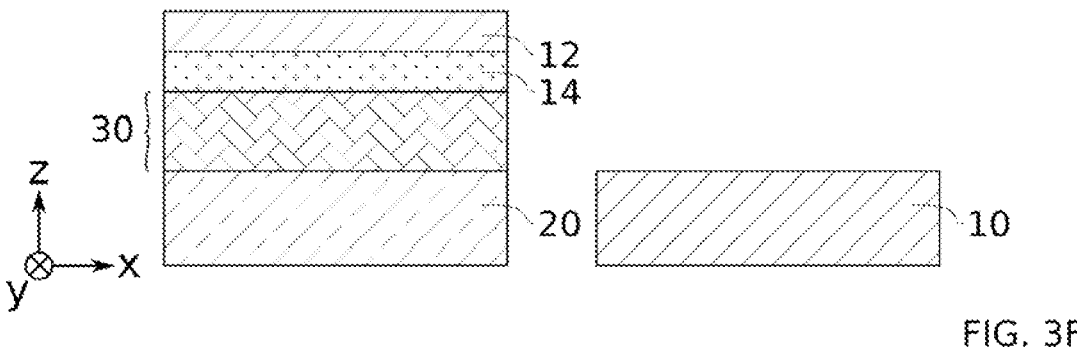

As illustrated in FIG. 3F, the substrate 10 is thus lifted off, and the layer of interest 12 is thus transferred onto the receiver substrate 20. The mirror 14 remains inserted between the receiver substrate 20 and the layer of interest 12. An optional flattening step, for example by chemical mechanical polishing CMP or by etching, can be performed on the surface of the layer of interest 12, for example to completely remove residues coming from the sacrificial buffer layer 11.

According to another possibility illustrated in FIGS. 4A to 4E, the functional layer 14 can also serve as an electrode in the scope of manufacturing a device, for example a BAW-type electroacoustic device.

Figure 4A:
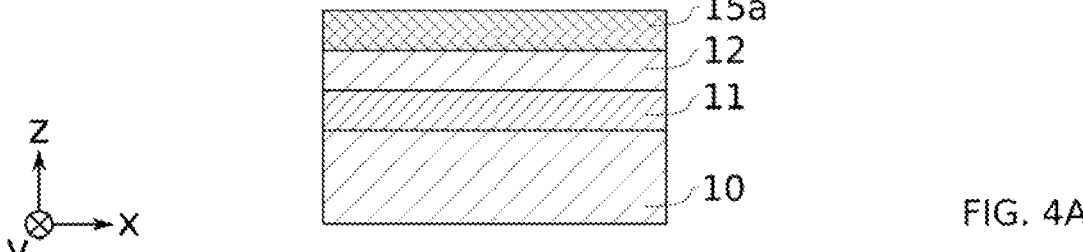
FIGS. 4A to 4E illustrate, as a transverse cross-section, a method for transferring a layer of interest according to another embodiment of the present invention.
Figure 4B:
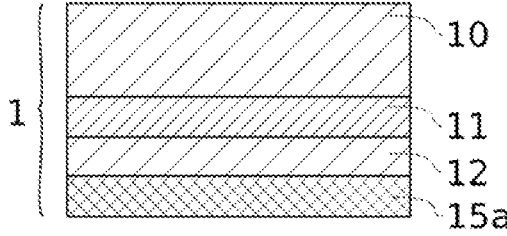
Figure 4B:
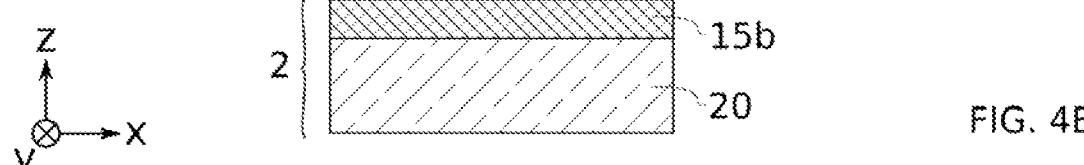
Figure 4C:
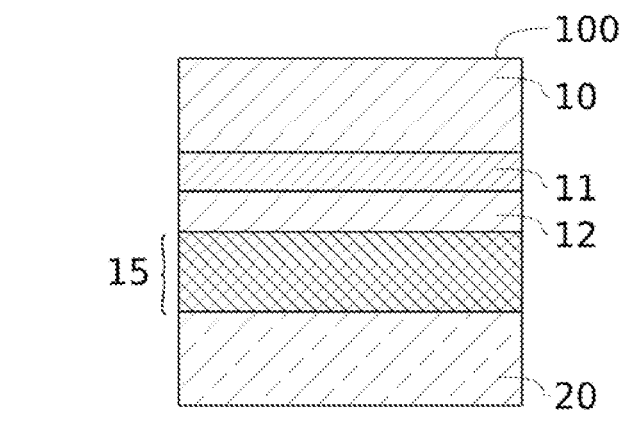

According to an example, a part 15a of the electrode can be formed on the layer of interest 12, as illustrated in FIG. 4A. A second electrode part 15b can be formed on the receiver substrate 20 (FIG. 4B). The bonding can subsequently be performed between the two electrode parts 15a, 15b, for example an Au—Au bonding in the case of gold Au-based electrode parts 15a, 15b, or an Al—Al bonding in the case of aluminium Al-based electrode parts 15a, 15b. The two electrode parts 15a, 15b thus advantageously serve as bonding layers to bond the two stacks 1, 2. Furthermore, after bonding, the two electrode parts 15a, 15b form an electrode 15 having a thickness $e_{15}$ adapted to the electrode function, typically of several hundred nanometres (FIG. 4C).

Figure 4D:
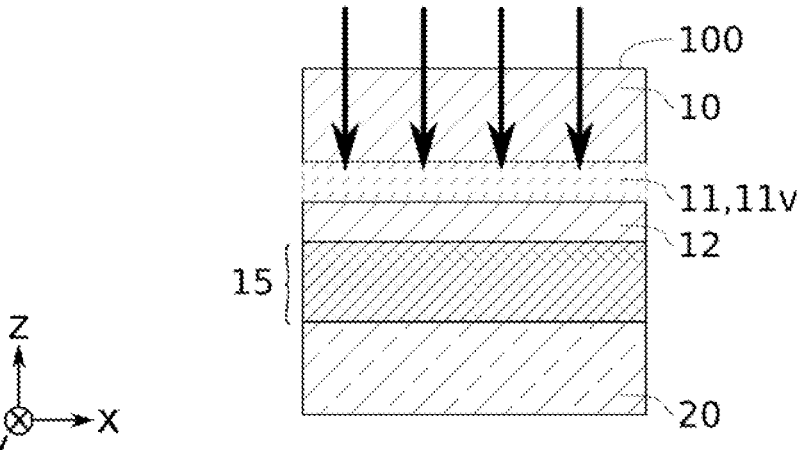

As above, the laser lift off is then performed (FIG. 4D). According to a possibility, the electrode 15 also forms a mirror for the light flow of wavelength λ, and makes it possible to increase the absorption of the light flow in the sacrificial buffer layer 11.

Figure 4E:
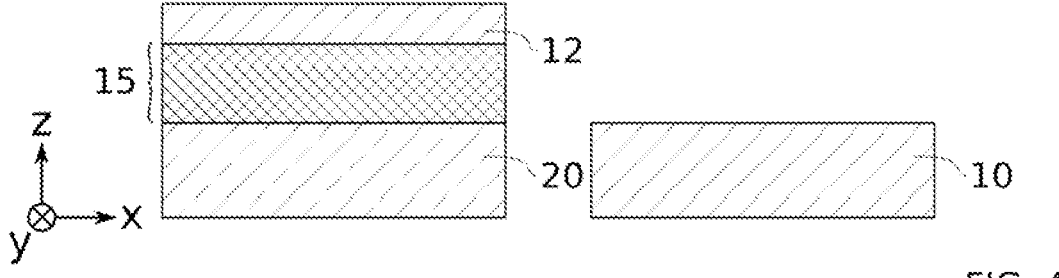

As illustrated in FIG. 4E, the substrate 10 is thus lifted off. Thus, a layer of interest 12 is directly formed on the electrode 15, it all being carried by a receiver substrate 20 typically chosen according to the desired application for the final device. A second electrode (not illustrated) can be formed on the surface of the layer of interest 12. According to an example, a BAW filter is thus formed on a silicon receiver substrate, with an LN/LT layer of fully controlled thickness and of excellent crystalline quality.

Figure 5:
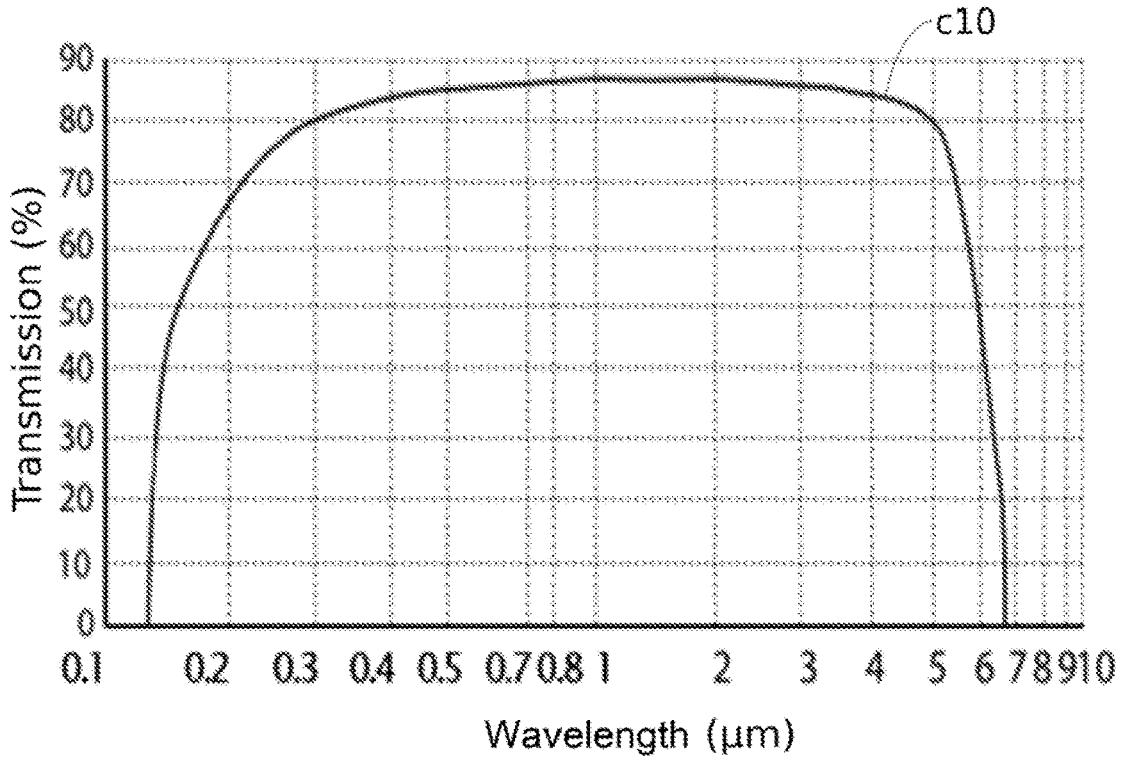
FIG. 5 illustrates an optical transmission curve of a sapphire substrate.
Figure 6:
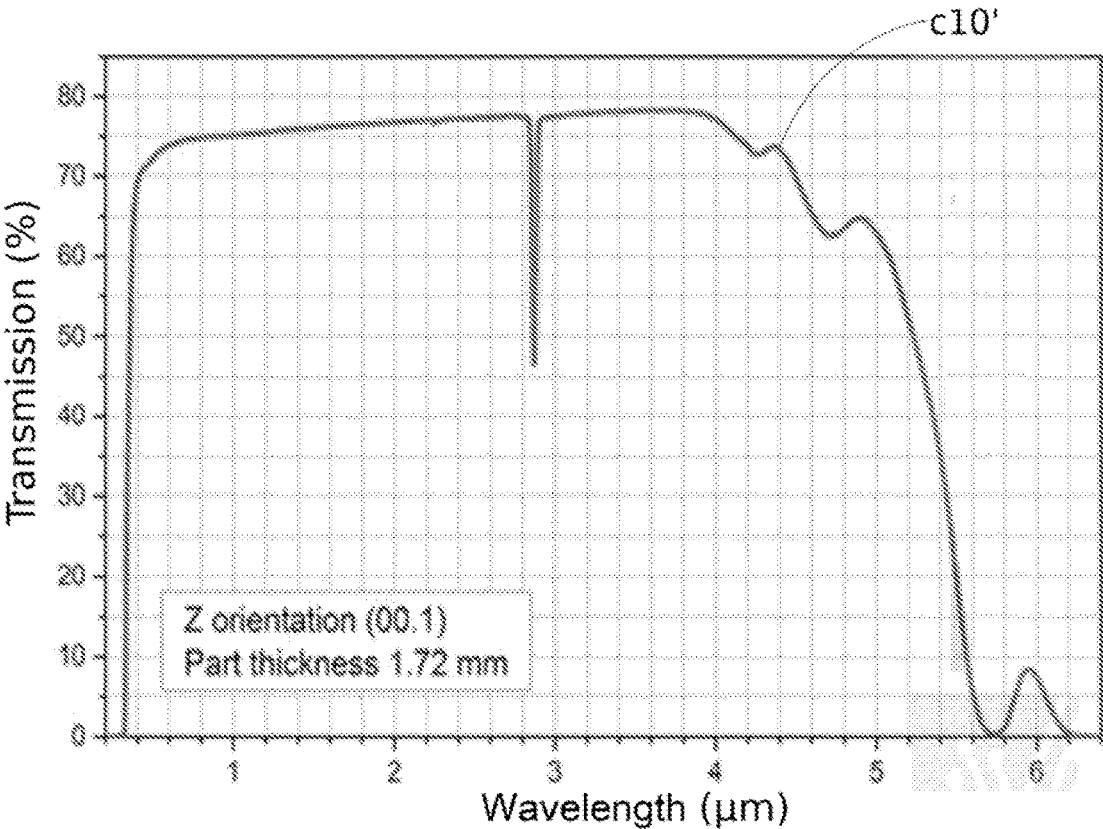
FIG. 6 illustrates an optical transmission curve of an LiNbO3 substrate.

FIGS. 5 and 6 illustrate transmission curves c10, c10' respectively for sapphire Al$_2$O$_3$ and for lithium niobate LiNbO3. These materials are transparent in the near-UV and in the IR, and fully suit for a donor substrate 10 in the implementation of the method according to the invention.

Figure 7:
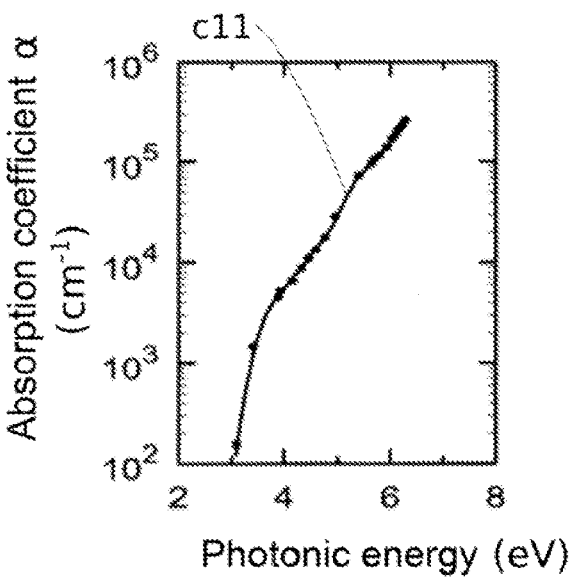
FIG. 7 illustrates an optical absorption curve of alu-minium nitride AlN.
Figure 8:
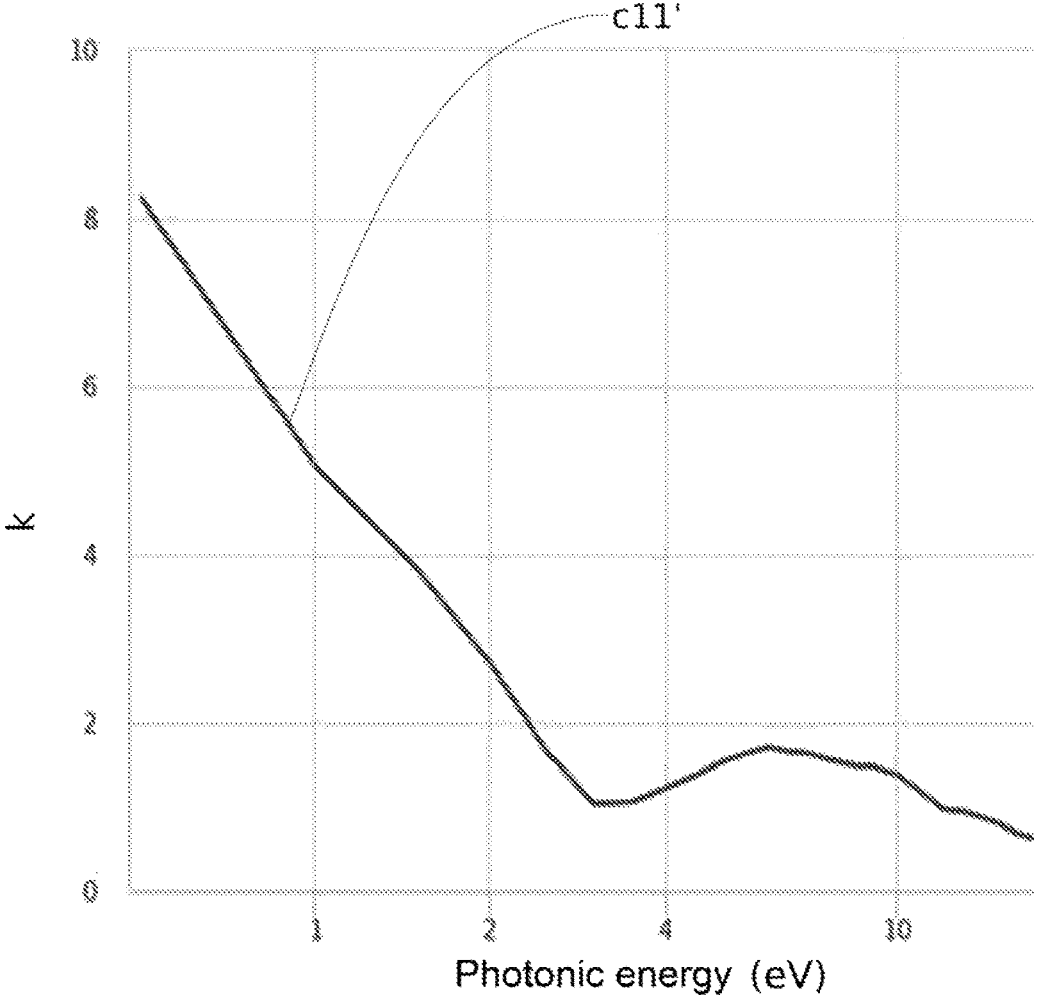
FIG. 8 illustrates an optical absorption curve of titanium nitride TIN.

FIGS. 7 and 8 illustrate absorption curves c11, c11' respectively for aluminium nitride AlN and for titanium nitride TiN. These materials are respectively absorbent in the near-UV and in the IR, and suit for a sacrificial buffer layer 11 in the implementation of the method according to the invention. Other nitride materials can be fully considered, in particular alloys, for example AlInN or GaInN, so as to adjust the absorption properties and/or the crystallographic structure vis-à-vis the donor substrate 10.

The invention is not limited to the embodiments described above.

The invention claimed is:

1. A method for transferring a layer of interest from a donor substrate to a receiver substrate, the layer of interest being based upon an ABO3 material, O being oxygen, A being at least one first chemical element taken from among sodium (Na), potassium (K), barium (Ba), lithium (Li) and lead (Pb), and B being at least one chemical element taken from among lead, zirconium (Zr), titanium (Ti), niobium (Nb), and tantalum (Ta), comprising:

providing the donor substrate made of a transparent material at a wavelength λ, forming at least one sacrificial buffer layer made of a sacrificial material absorbing at the wavelength λ, by epitaxy on the donor substrate, forming the layer of interest by epitaxy on the at least one sacrificial buffer layer, bonding the layer of interest on the receiver substrate, and illuminating by laser, at the wavelength 2 the at least one sacrificial buffer layer through the donor substrate, so as to remove at least partially the at least one sacrificial buffer layer to separate the layer of interest from the donor substrate, wherein forming the at least one sacrificial buffer layer comprises at least one sequence comprising:

forming a first sacrificial buffer layer based upon the absorbent sacrificial material, then forming an interlayer based upon the transparent material of the donor substrate, then forming a second sacrificial buffer layer based upon the absorbent sacrificial material.

2. The method according to claim 1, wherein the sacrificial material is different from the ABO3 material.

3. The method according to claim 1, wherein forming the at least one sacrificial buffer layer and the layer of interest by epitaxy are configured such that the at least one sacrificial buffer layer and the layer of interest have together and with the donor substrate a continuity of crystalline structure.

4. The method according to claim 1, wherein the ABO3 material is taken from among lithium niobate LiNbO3, lithium tantalate LiTaO3, or an Li(Nb,Ta)O3 alloy.

5. The method according to claim 1, wherein the wavelength λ of the laser is chosen in the infrared range, and wherein the sacrificial material absorbing in the at least one sacrificial buffer layer is based upon a transition refractory nitride.

6. The method according to claim 5, wherein the transition refractory nitride is selected from TiN, VN, ZrN, TaN, HfN, NbN, or their alloys.

7. The method according to claim 1, wherein the wavelength λ of the laser is chosen in the ultraviolet range, and wherein the sacrificial material absorbing the at least one sacrificial buffer layer is based upon a III-N nitride.

8. The method according to claim 7, wherein the III-N nitride is selected from aluminium nitride AlN, gallium nitride GaN, boron nitride BN, indium nitride InN, or their alloys.

9. The method according to claim 1, wherein forming the at least one sacrificial buffer layer is configured, such that the at least one sacrificial buffer layer has a thickness less than a critical thickness beyond which structural defects appear in the at least one sacrificial buffer layer during epitaxy.

10. The method according to claim 1, wherein the donor substrate and the layer of interest are based upon the same material.

11. The method according to claim 1, further comprising, before bonding of the layer of interest on the receiver substrate, forming a functional layer on the layer of interest, and wherein the bonding of the layer of interest on the receiver substrate is done by way of the functional layer.

12. The method according to claim 11, wherein the functional layer is at least one from among an electrode, a mirror reflecting at the wavelength λ, and an acoustic confinement layer.

13. The method according to claim 1, wherein the transparent material of the donor substrate is chosen from among LiNbO3, LiTaO3, and sapphire Al2O3.

14. The method according to claim 1, wherein the receiver substrate is chosen as silicon-based.

15. The method according to claim 1, further comprising, after separation of the layer of interest from the donor substrate, a healing annealing.

16. The method according to claim 1, further comprising, after formation of the layer of interest, flattening the layer of interest.

17. The method according to claim 1, comprising illuminating the at least one sacrificial buffer layer by laser alternatingly with a first wavelength different from a second wavelength.

18. A method for transferring a layer of interest from a donor substrate to a receiver substrate, the layer of interest being based upon an ABO3 material, O being oxygen, A being at least one first chemical element taken from among sodium (Na), potassium (K), barium (Ba), lithium (Li) and lead (Pb), and B being at least one chemical element taken from among lead, zirconium (Zr), titanium (Ti), niobium (Nb), and tantalum (Ta), comprising:

providing the donor substrate made of a transparent material at a wavelength λ, forming at least one sacrificial buffer layer made of a sacrificial material absorbing at the wavelength λ, by epitaxy on the donor substrate, the sacrificial material being different from the ABO3 material, forming the layer of interest by epitaxy on the at least one sacrificial buffer layer, bonding the layer of interest on the receiver substrate, and illuminating by laser, alternatingly with a first wavelength different from a second wavelength, the at least one sacrificial buffer layer through the donor substrate, so as to remove at least partially the at least one sacrificial buffer layer to separate the layer of interest from the donor substrate, wherein the first wavelength is in the UV range and the second wavelength is in the IR range.

19. The method according to claim 18, comprising forming the at least one sacrificial buffer layer to have a plural of sublayers including a first sublayer based upon the sacrificial material absorbing at the wavelength $\lambda$ and a second sublayer based upon a material transparent to the wavelength $\lambda$.

20. The method according to claim 19, comprising each of the first sublayer and second sublayer having a thickness less than a thickness at which relaxation of stress occurs.

* * * * *